(12) United States Patent
Shih et al.

(10) Patent No.: US 11,774,844 B2
(45) Date of Patent: *Oct. 3, 2023

(54) EXTREME ULTRAVIOLET MASK AND METHOD OF MANUFACTURING THE SAME

(71) Applicant: TAIWAN SEMICONDUCTOR MANUFACTURING COMPANY, LTD., Hsinchu (TW)

(72) Inventors: Chih-Tsung Shih, Hsinchu (TW); Tsung-Chih Chien, Caotun Township (TW); Shih-Chi Fu, Zhudong Township (TW); Chi-Hua Fu, Hsinchu County (TW); Kuotang Cheng, Hsinchu (TW); Bo-Tsun Liu, Taipei (TW); Tsung Chuan Lee, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/694,341

(22) Filed: Mar. 14, 2022

(65) Prior Publication Data
US 2022/0197127 A1 Jun. 23, 2022

Related U.S. Application Data

(63) Continuation of application No. 16/530,218, filed on Aug. 2, 2019, now Pat. No. 11,275,301.

(60) Provisional application No. 62/726,065, filed on Aug. 31, 2018.

(51) Int. Cl.
| | | |
|---|---|---|
| G03F 1/38 | (2012.01) | |
| G03F 1/46 | (2012.01) | |
| G03F 1/24 | (2012.01) | |
| G03F 1/22 | (2012.01) | |
| G03F 7/20 | (2006.01) | |

(52) U.S. Cl.
CPC ............... G03F 1/24 (2013.01); G03F 1/38 (2013.01); G03F 1/46 (2013.01); *G03F 1/22* (2013.01); *G03F 7/2004* (2013.01)

(58) Field of Classification Search
CPC ..... G03F 1/24; G03F 1/38; G03F 1/46; G03F 7/2004
USPC ............................................................ 430/5
See application file for complete search history.

(56) References Cited

U.S. PATENT DOCUMENTS

| | | | |
|---|---|---|---|
| 9,436,078 B2 | 9/2016 | Sun et al. | |
| 10,012,898 B2 | 7/2018 | Brunner et al. | |
| 10,838,305 B2 | 11/2020 | Yu et al. | |
| 11,275,301 B2 * | 3/2022 | Shih | G03F 1/46 |
| 2016/0223896 A1 | 8/2016 | Sun et al. | |
| 2018/0143527 A1 | 5/2018 | Seo et al. | |

FOREIGN PATENT DOCUMENTS

| | | |
|---|---|---|
| TW | I567479 B | 1/2017 |
| TW | 201730663 A | 9/2017 |

OTHER PUBLICATIONS

Non-Final Office Action issued in U.S. Appl. No. 16/530,218, dated Jun. 28, 2021.
Notice of Allowance issued in U.S. Appl. No. 16/530,218, dated Nov. 8, 2021.

* cited by examiner

*Primary Examiner* — Christopher G Young
(74) *Attorney, Agent, or Firm* — McDermott Will & Emery LLP

(57) ABSTRACT

An extreme ultraviolet (EUV) mask includes a multilayer Mo/Si stack comprising alternating Mo and Si layers disposed over a first major surface of a mask substrate, a capping layer made of ruthenium (Ru) disposed over the multilayer Mo/Si stack, and an absorber layer on the capping layer. The EUV mask includes a circuit pattern area and a particle attractive area, and the capping layer is exposed at bottoms of patterns in the particle attractive area.

20 Claims, 10 Drawing Sheets

| Surface | Tool | Move | Adder | Ti/Si/O | Al | Fe/Ni | C |
|---|---|---|---|---|---|---|---|
| Absorber | A | 417 | 4 | 4 | 0 | 0 | 0 |
| Ru | | 421 | 13 | 6 | 5 | 2 | 0 |
| Absorber | B | 341 | 0 | 0 | 0 | 0 | 0 |
| Ru | | 399 | 2 | 0 | 0 | 0 | 2 |

FIG. 11

EXTREME ULTRAVIOLET MASK AND METHOD OF MANUFACTURING THE SAME

RELATED APPLICATIONS

This application is a continuation of U.S. patent application Ser. No. 16/530,218 filed Aug. 2, 2019, now U.S. Pat. No. 11,275,301, which claims priority of U.S. Provisional Patent Application No. 62/726,065 filed Aug. 31, 2018, of each of which disclosure is incorporated herein by reference.

BACKGROUND

In EUV photolithography, the EUV light rays emitted from a plasma are reflected off a collector mirror, directed toward a patterned EUV mask, and reflected off the mask onto the target substrate. An EUV reflective mask includes a substrate, an EUV reflective multilayered structure, and an EUV absorbing layer ('absorber'). The EUV absorbing layer is patterned by etching and photolithographic techniques to expose the underneath EUV reflecting layers for EUV photolithographic patterning of desired patterns on the target substrate while the EUV absorbing layers absorb the EUV light rays so as not to pattern the target substrate in the undesired regions. Therefore, the thickness of the EUV absorbing layer, the thickness of each of the layers in the EUV reflective multilayered structure, surface roughness of the above layers, and the homogeneity of the material properties throughout the layers, are extremely important to the quality of EUV light irradiating the target substrate. In industrial practice, off-axis illumination or other factors can cause a shadow effect on the target substrate and variations in the thickness of the EUV light absorbing layer can affect the proper functioning of the combination of the EUV light absorbing layer and the EUV reflecting multi-layered structure.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 11 shows experimental results illustrating effect of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of" In the present disclosure, a phrase "one of A, B and C" means "A, B and/or C" (A, B, C, A and B, A and C, B and C, or A, B and C), and does not mean one element from A, one element from B and one element from C, unless otherwise described.

To address the trend of the Moore's law for decreasing size of chip components and the demand of higher computing power chips for mobile electronic devices such as smart phones with computer functions, multi-tasking capabilities, or even with workstation power. Smaller wavelength photolithography exposure systems are desirable. Extreme ultraviolet (EUV) photolithography technique uses an EUV radiation source to emit an EUV light ray with wavelength of 13.5 nm. Because this wavelength is also in the x-ray radiation wavelength region, the EUV radiation source is also called a soft x-ray radiation source. The EUV light rays emitted from a laser-produced plasma (LPP) are collected by a collector mirror and reflected toward a patterned mask.

Figure 1:
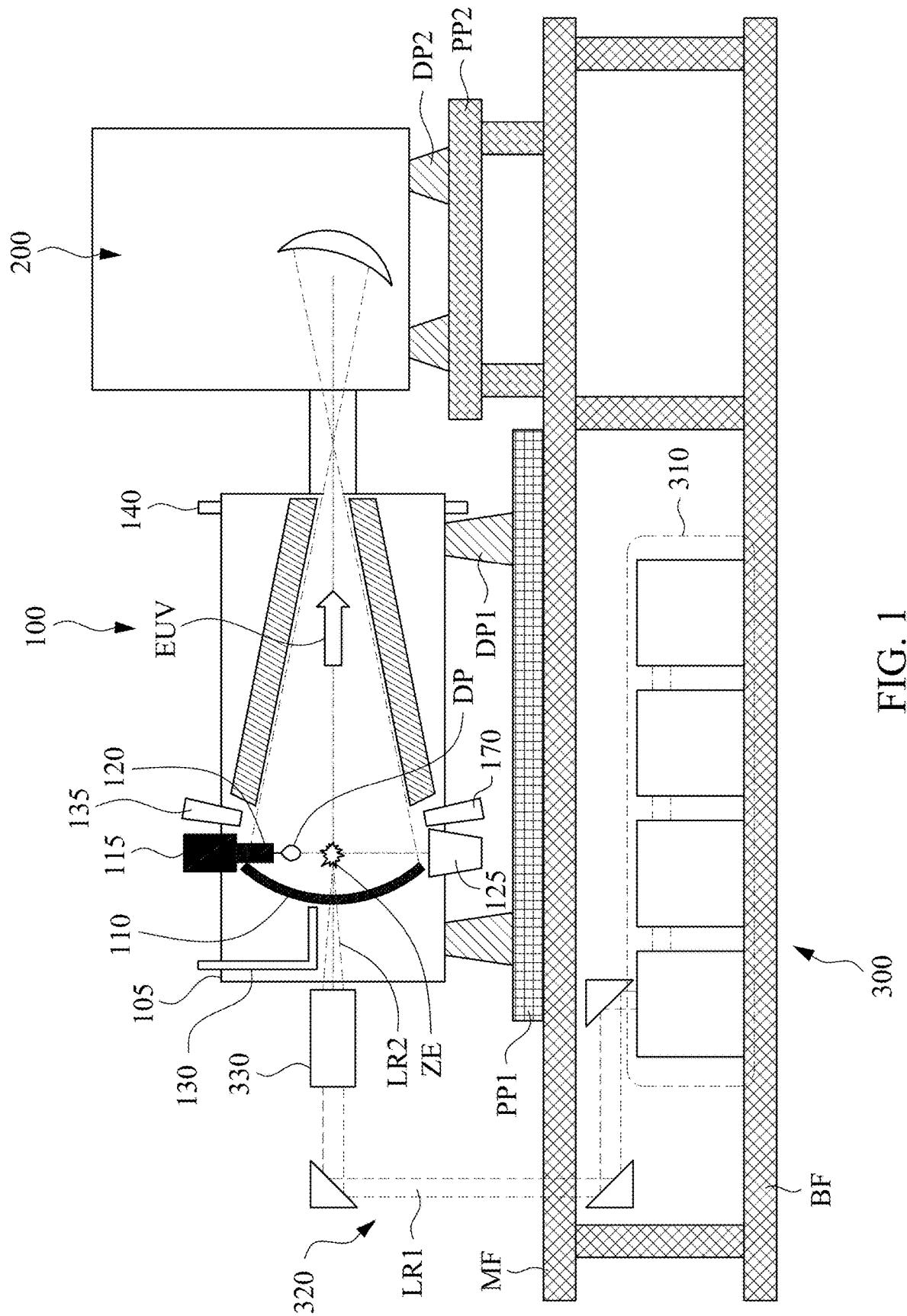
FIG. 1 shows an extreme ultraviolet lithography tool according to an embodiment of the disclosure.

FIG. 1 is a schematic view of an EUV lithography tool with an LPP-based EUV radiation source, in accordance with some embodiments of the present disclosure. The EUV lithography system includes an EUV radiation source 100 to generate EUV radiation, an exposure device 200, such as a scanner, and an excitation laser source 300. As shown in FIG. 1, in some embodiments, the EUV radiation source 100 and the exposure device 200 are installed on a main floor MF of a clean room, while the excitation laser source 300 is installed in a base floor BF located under the main floor. Each of the EUV radiation source 100 and the exposure device 200 are placed over pedestal plates PP1 and PP2 via dampers DP1 and DP2, respectively. The EUV radiation source 100 and the exposure device 200 are coupled to each other by a coupling mechanism, which may include a focusing unit.

The EUV lithography tool is designed to expose a resist layer to EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure device 200 includes various reflective optic components, such as convex/concave/flat mirrors, a mask holding mechanism including a mask stage, and wafer holding mechanism. The EUV radiation EUV generated by the EUV radiation source 100 is guided by the reflective optical components onto a mask secured on the mask stage. In some embodiments, the mask stage includes an electrostatic chuck (e-chuck) to secure the mask.

Figure 2:
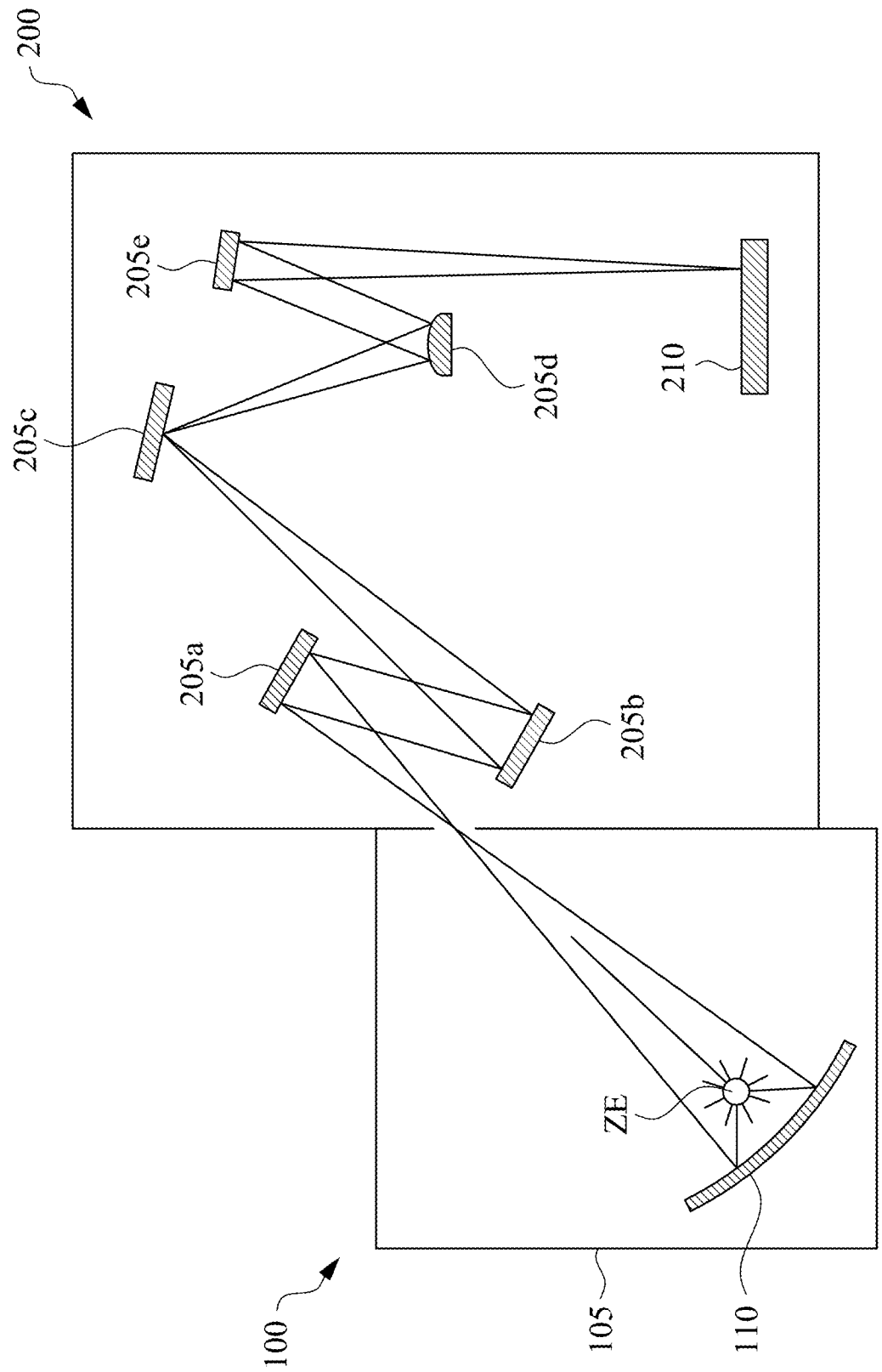
FIG. 2 shows a schematic diagram of a detail of an extreme ultraviolet lithography tool according to an embodiment of the disclosure.

FIG. 2 is a simplified schematic diagram of a detail of an extreme ultraviolet lithography tool according to an embodiment of the disclosure showing the exposure of photoresist coated substrate 210 with a patterned beam of EUV light. The exposure device 200 is an integrated circuit lithography tool such as a stepper, scanner, step and scan system, direct write system, device using a contact and/or proximity mask, etc., provided with one or more optics 205a, 205b, for example, to illuminate a patterning optic 205c, such as a reticle, with a beam of EUV light, to produce a patterned beam, and one or more reduction projection optics 205d, 205e, for projecting the patterned beam onto the substrate 210. A mechanical assembly (not shown) may be provided for generating a controlled relative movement between the substrate 210 and patterning optic 205c. As further shown in FIG. 2, the EUVL tool includes an EUV light source 100 including an EUV light radiator ZE emitting EUV light in a chamber 105 that is reflected by a collector 110 along a path into the exposure device 200 to irradiate the substrate 210.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gradings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, the term "optic", as used herein, is directed to, but not limited to, components which operate solely or to advantage within one or more specific wavelength range(s) such as at the EUV output light wavelength, the irradiation laser wavelength, a wavelength suitable for metrology or any other specific wavelength.

Because gas molecules absorb EUV light, the lithography system for the EUV lithography patterning is maintained in a vacuum or a-low pressure environment to avoid EUV intensity loss.

In the present disclosure, the terms mask, photomask, and reticle are used interchangeably. In the present embodiment, the patterning optic 205c is a reflective mask. In an embodiment, the reflective mask 205c includes a substrate with a suitable material, such as a low thermal expansion material or fused quartz. In various examples, the material includes $TiO_2$ doped $SiO_2$, or other suitable materials with low thermal expansion. The reflective mask 205c includes multiple reflective layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configured to highly reflect the EUV light. The mask 205c may further include a capping layer, such as ruthenium (Ru), disposed on the ML for protection. The mask further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

In various embodiments of the present disclosure, the photoresist coated substrate 210 is a semiconductor wafer, such as a silicon wafer or other type of wafer to be patterned.

The EUVL tool further includes other modules or is integrated with (or coupled with) other modules in some embodiments.

As shown in FIG. 1, the EUV radiation source 100 includes a target droplet generator 115 and a LPP collector 110, enclosed by a chamber 105. In various embodiments, the target droplet generator 115 includes a reservoir to hold a source material and a nozzle 120 through which target droplets DP of the source material are supplied into the chamber 105.

In some embodiments, the target droplets DP are droplets of tin (Sn), lithium (Li), or an alloy of Sn and Li. In some embodiments, the target droplets DP each have a diameter in a range from about 10 microns (μm) to about 100 μm. For example, in an embodiment, the target droplets DP are tin droplets, having a diameter of about 10 μm to about 100 μm. In other embodiments, the target droplets DP are tin droplets having a diameter of about 25 μm to about 50 μm. In some embodiments, the target droplets DP are supplied through the nozzle 120 at a rate in a range from about 50 droplets per second (i.e., an ejection-frequency of about 50 Hz) to about 50,000 droplets per second (i.e., an ejection-frequency of about 50 kHz).

Referring back to FIG. 1, an excitation laser LR2 generated by the excitation laser source 300 is a pulse laser. The laser pulses LR2 are generated by the excitation laser source 300. The excitation laser source 300 may include a laser generator 310, laser guide optics 320 and a focusing apparatus 330. In some embodiments, the laser source 310 includes a carbon dioxide ($CO_2$) or a neodymium-doped yttrium aluminum garnet (Nd:YAG) laser source with a wavelength in the infrared region of the electromagnetic spectrum. For example, the laser source 310 has a wavelength of 9.4 μm or 10.6 μm, in an embodiment. The laser light LR1 generated by the laser generator 300 is guided by the laser guide optics 320 and focused into the excitation laser LR2 by the focusing apparatus 330, and then introduced into the EUV radiation source 100.

In some embodiments, the excitation laser LR2 includes a pre-heat laser and a main laser. In such embodiments, the pre-heat laser pulse (interchangeably referred to herein as the "pre-pulse") is used to heat (or pre-heat) a given target droplet to create a low-density target plume with multiple smaller droplets, which is subsequently heated (or reheated) by a pulse from the main laser, generating increased emission of EUV light.

In various embodiments, the pre-heat laser pulses have a spot size about 100 μm or less, and the main laser pulses have a spot size in a range of about 150 μm to about 300 μm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser LR2 is matched with the ejection-frequency of the target droplets DP in an embodiment.

The excitation laser LR2 is directed through windows (or lenses) into the zone of excitation ZE. The windows are made of a suitable material substantially transparent to the laser beams. The generation of the pulse lasers is synchronized with the ejection of the target droplets DP through the nozzle 120. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation EUV, which is collected by the collector mirror 110. The collector 110 further reflects and focuses the EUV radiation for the lithography exposing processes performed through the exposure device 200. The droplet catcher 125 is used for catching excessive target droplets. For example, some target droplets may be purposely missed by the laser pulses.

Referring back to FIG. 1, the collector 110 is designed with a proper coating material and shape to function as a mirror for EUV collection, reflection, and focusing. In some embodiments, the collector 110 is designed to have an ellipsoidal geometry. In some embodiments, the coating material of the collector 100 is similar to the reflective multilayer of the EUV mask. In some examples, the coating material of the collector 110 includes a ML (such as a plurality of Mo/Si film pairs) and may further include a capping layer (such as Ru) coated on the ML to substantially reflect the EUV light. In some embodiments, the collector 110 may further include a grating structure designed to effectively scatter the laser beam directed onto the collector 110. For example, a silicon nitride layer is coated on the collector 110 and is patterned to have a grating pattern.

In such an EUV radiation source, the plasma caused by the laser application creates physical debris, such as ions, gases and atoms of the droplet, as well as the desired EUV radiation. It is necessary to prevent the accumulation of material on the collector 110 and also to prevent physical debris exiting the chamber 105 and entering the exposure device 200.

As shown in FIG. 1, in the present embodiment, a buffer gas is supplied from a first buffer gas supply 130 through the aperture in collector 110 by which the pulse laser is delivered to the tin droplets. In some embodiments, the buffer gas is $H_2$, He, Ar, $N_2$ or another inert gas. In certain embodiments, $H_2$ used as H radicals generated by ionization of the buffer gas can be used for cleaning purposes. The buffer gas can also be provided through one or more second buffer gas supplies 135 toward the collector 110 and/or around the edges of the collector 110. Further, the chamber 105 includes one or more gas outlets 140 so that the buffer gas is exhausted outside the chamber 105.

Hydrogen gas has low absorption to the EUV radiation. Hydrogen gas reaching the coating surface of the collector 110 reacts chemically with a metal of the droplet forming a hydride, e.g., metal hydride. When tin (Sn) is used as the droplet, stannane ($SnH_4$), which is a gaseous byproduct of the EUV generation process, is formed. The gaseous $SnH_4$ is then pumped out through the outlet 140.

Figure 3:
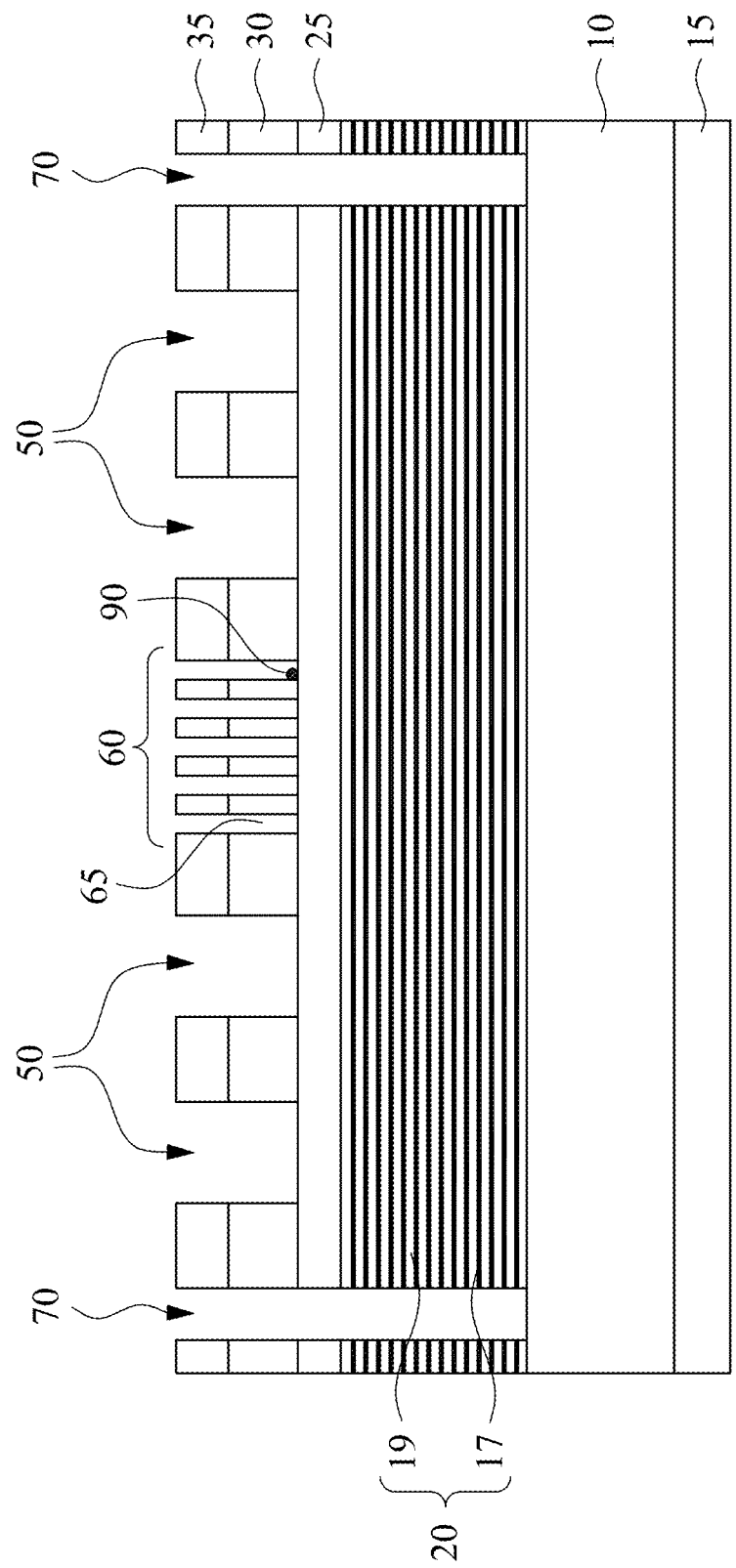
FIG. 3 shows a cross sectional view of an EUV mask according to an embodiment of the present disclosure.

FIG. 3 show a cross sectional view of an EUV mask (or a reticle) according to an embodiment of the present disclosure. The EUV mask includes a multilayered stack 20 of molybdenum layers 17 and silicon layers 19 ("Mo/Si stack 20"). The Mo/Si stack 20 includes alternating Mo layers 17 and Si layers 19 disposed over a first major surface of a mask substrate 10. A capping layer 25 is disposed over the Mo/Si stack 20, and an EUV absorbing layer or absorber 30 is disposed over the capping layer 25. An anti-reflection layer 35 is disposed over the EUV absorbing layer 30. In some embodiments, a conductive backside coating layer 15 is optionally deposited on the second major surface of the mask substrate 10 opposite to the first major surface. The conductive backside coating layer 15 is used to fix the mask for photolithographic operation by electrostatic chucking in some embodiments. In an embodiment, the conductive layer 15 is formed of a ceramic compound including chromium nitride or any suitable material for electrostatic chucking of the mask.

The mask substrate 10 is made of a low thermal expansion glass material including titanium oxide doped silicon dioxide, or any other suitable low thermal expansion materials such as quartz, silicon, silicon carbide, black diamond, and/or other low thermal expansion substances known in the art that can minimize the image distortion due to mask heating in the EUV photolithographic environment, in some embodiments of the present disclosure. The mask substrate 10 has a low defect level, such as a high purity single crystal substrate, and a low level of surface roughness, as measured using an atomic force microscope.

The multilayered stack 20 of alternating Mo layers 17 and Si layers 19 deposited over the mask substrate 10 provides Fresnel resonant reflections across the interfaces between the Mo layer and Si layer of different refractive indices by use of an appropriate thickness for each layer inside the multilayer in some embodiments of the present disclosure. High quality reflections rely on constructive interference by phase-matching and intensity adding-up of light rays reflected from different layers. The thickness of the layers depends on the wavelength of the incident light and the angle of incidence to the EUV mask. For a specific angle of incidence, the thickness of each of the layers of the multilayered stack 20 is chosen to achieve maximal constructive interference for light reflected at different interfaces of the multilayered stack 20. Thus, even thickness and low surface roughness of each of the layers in the multilayered stack 20 are required for high quality Fresnel resonant reflections. A thickness of each of the layers in the multilayered stack 20 is 5-7 nm in some embodiments of the present disclosure.

In some embodiments of the present disclosure, the multilayered stack 20 includes alternating molybdenum layers 17 and beryllium layers 19. In some embodiments of the present disclosure, the number of layers in the multilayered stack 20 is in a range from 20 to 100 although any number of layers is allowed as long as sufficient reflectivity is maintained for imaging the target substrate. In some embodiments, the reflectivity is higher than about 70%. In some embodiments of the present disclosure, the Mo/Si multilayer stack 20 includes about 30 to about 60 alternating layers of Mo and Si. In other embodiments of the present disclosure, the Mo/Si multilayer stack 20 includes about 40 to about 50 alternating layers each of Mo and Si.

The capping layer 25 formed over the multilayered stack 20 prevents oxidation of the multilayered stack 20 in some embodiments. In some embodiments of the present disclosure, the capping layer 25 is formed of a material including ruthenium (Ru). In some embodiments of the present disclosure, the capping layer 25 has a thickness of about 7 nm.

The EUV absorbing layer or absorber 30 formed over the capping layer 25 absorbs radiation with wavelength in a range of EUV wavelengths. The EUV absorbing layer 30 is formed of a single layer or multiple layers in some embodiments of the present disclosure. In some embodiments of the present disclosure, the EUV absorbing layer 30 is formed of a material including a tantalum compound. In some embodiments of the present disclosure, the EUV absorbing layer 30 is made of TaN or TaBN. In some embodiments of the present disclosure, the material used to make the EUV absorbing layer 30 also includes molybdenum, palladium, zirconium, nickel silicide, titanium, titanium nitride, chromium, chromium oxide, aluminum oxide, aluminum-copper alloy, or other suitable materials. The thickness of the EUV absorbing layer 30 is not limited as long as the overall reflectivity of the EUV mask is more than 70%.

The anti-reflection layer 35 disposed over the EUV absorbing layer 30 is formed of a material including $SiO_2$, SiN, TaBO, $TaO_5$, $Cr_2O_3$, ITO (indium tin oxide), or any suitable material, in some embodiments of the present disclosure. The anti-reflection layer 35 reduces reflections of photolithographic radiation.

In some embodiments, an EUV mask is a reflective mask, and the Mo/Si multilayer stack 20 reflects the EUV light, while the absorber 30 absorbs the EUV light. As shown in FIG. 3, one or more circuit patterns 50 are formed on the EUV mask by partially removing the anti-reflection layer 35 and the absorber 30. In addition, a black border area 70 surrounding a circuit pattern region and penetrating to the substrate is formed. Further, particle attractive regions (patterns) 60 are formed in an area in which no circuit pattern is formed.

The circuit patterns are formed by using one or more lithography (e.g., electron beam lithography) and etching operations. During the etching operations, particles may fall on the surface of the EUV mask. The inventors of the present disclosure found that when the surface is an Ru surface (the capping layer 25), particles are more likely deposited on the Ru surface than the surface of the absorber 30 and/or the anti-reflection layer 35.

In some examples, the area in which no circuit pattern is formed is covered by an absorber 30 so that the EUV light is not reflected. In view of the above finding, the EUV mask according to embodiments of the present disclosure includes one or more particle attractive regions 60, in which fine patterns 65 exposing the Ru surface 25 are formed as shown in FIG. 3.

When an EUV light is applied to the EUV mask, local plasma is generated, which makes the EUV mask negatively charged. Accordingly, a conductive layer, such as a Ru layer attracts more particles than a non-conductive or a low conductive layer.

The fine patterns 65 in the particle attractive regions 60 have a dimension smaller than a resolution limit of the EUV exposure apparatus, and thus the fine patterns 65 are not printable as resist pattern on the wafer.

In some embodiments, the fine patterns 65 are line-and-space patterns having a pitch smaller than $\lambda/(2NA)$, where $\lambda$ is the wavelength of the EUV light and NA is a numerical aperture of the EUV exposure apparatus. In some embodiments, NA is in a range from about 0.2 to about 0.4. In some embodiments, the line and/or space width of the line-and-space patterns is in a range from about 2 nm to about 20 nm, and is in a range from about 5 nm to about 10 nm in other embodiments. The pattern size in a pattern layout generally refers to an actual circuit pattern size formed on a wafer. Thus, when the EUV mask is a 4× mask, the pattern size on an EUV mask is four times a pattern size on the semiconductor wafer. In the present disclosure, the pattern size is the pattern size as formed on a wafer, unless otherwise indicated. Thus, for example, the pattern size on the wafer is 10 nm, the size on the EUV mask is 40 nm.

In other embodiments, the fine patterns 65 are hole patterns having a pitch smaller than $\sqrt{2}\lambda/(2NA)$. In some embodiments, the diameter of the hole patterns is in a range from about 2 nm to about 20 nm, and is in a range from about 5 nm to about 10 nm in other embodiments.

Figure 4:
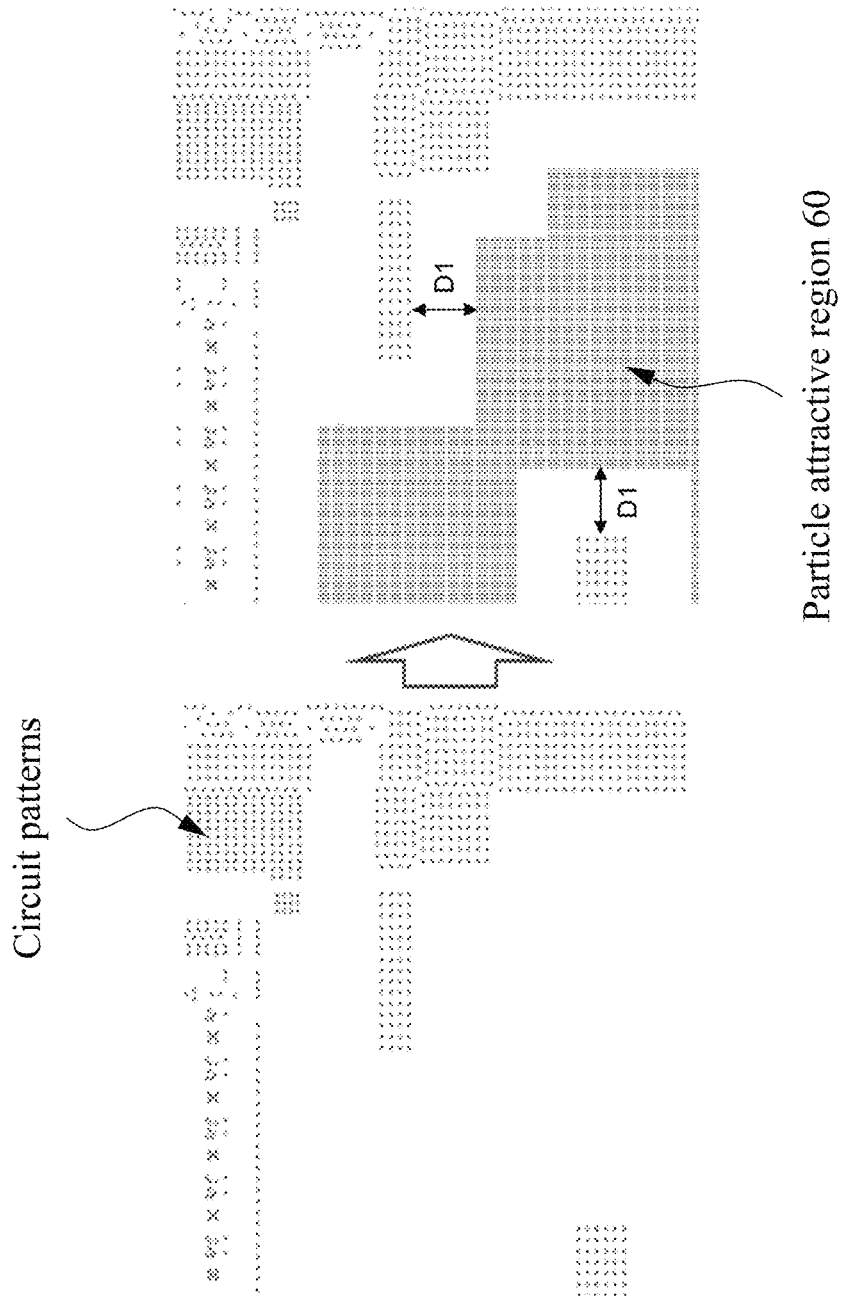
FIG. 4 shows a layout before and after the particle attractive patterns are added to a mask pattern according to an embodiment of the present disclosure.

In some embodiments, as shown in FIG. 4, a distance D1 between the circuit pattern to be printed and the particle attractive region 60 is equal to or greater than 0.5 μm on the mask. In certain embodiments, D1 is in a range from about 0.5 μm to about 5.0 μm on the mask.

Figure 5B:
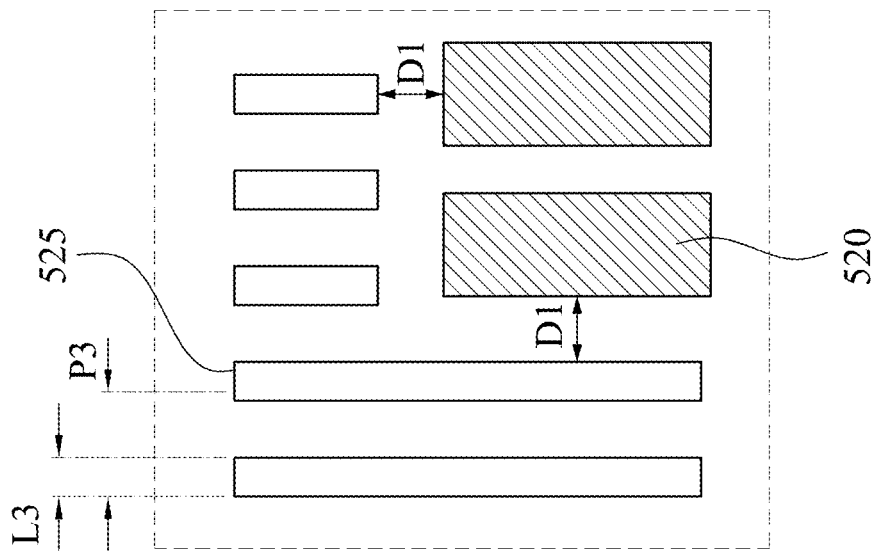
FIG. 5B shows non-printable fine patterns according to another embodiment of the present disclosure.
Figure 5A:
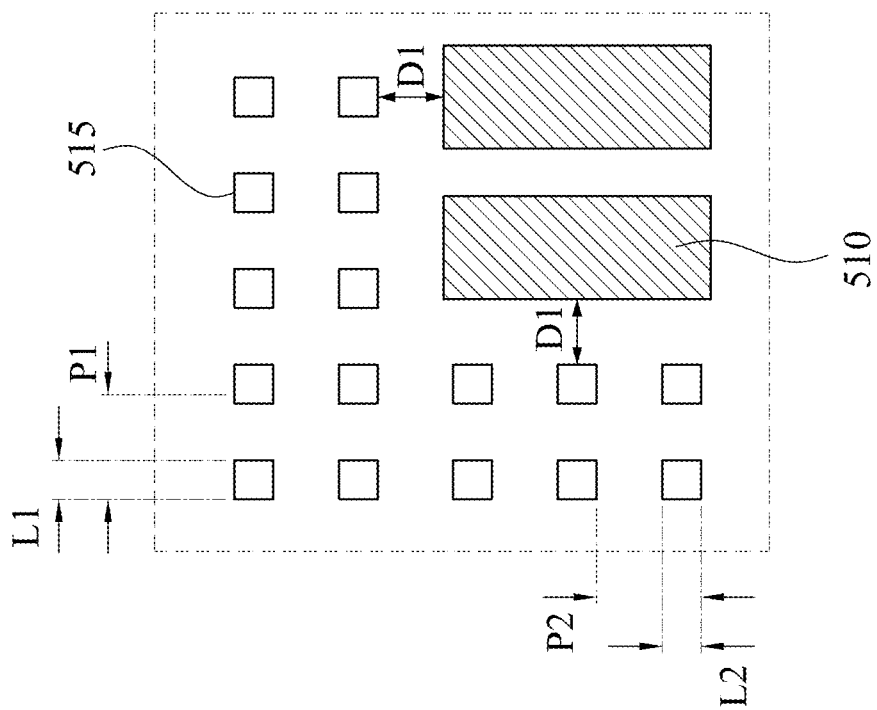
FIG. 5A shows non-printable fine patterns according to an embodiment of the present disclosure.

FIG. 5A shows non-printable fine patterns for the particle attractive regions 60 according to an embodiment of the present disclosure, and FIG. 5B shows non-printable fine patterns according to another embodiment of the present disclosure.

In some embodiments, the non-printable fine patterns, the bottoms of which the Ru surface is exposed, have a square or a circular shape on the EUV mask having a size smaller than the threshold size (e.g., the resolution limit) and are periodically arranged in a matrix, as shown in FIG. 5A. In some embodiments, the non-printable fine patterns 515 have a length L1 and L2 and are arranged with a pitch P1 and P2, respectively. In certain embodiments, L1=L2 and P1=P2. As shown in FIG. 5A, the non-printable fine patterns 615 are generated to be located a distance D1 from the actual circuit patterns 510. In some embodiments, L1 and/or L2 is in a range from about 2 nm to about 20 nm, and is in a range from about 5 nm to about 10 nm in other embodiments. In some embodiments, P1 and/or P2 is in a range from about 4 nm to about 100 nm, and is in a range from about 10 nm to about 50 nm in other embodiments.

In FIG. 5B, line-and-space patterns periodically arranged in one direction are used as non-printable fine patterns 525. The Ru surface is exposed at the bottoms of the patterns. The line-and-space patterns have a width (length) L3 and a pitch P3, which is smaller than the threshold (e.g., resolution limit), as shown in FIG. 5B. The pattern density of the non-printable dummy patterns 525 can be defined as (L3/P3). As shown in FIG. 5B, the non-printable dummy patterns 525 are generated to have a distance D1 from the actual circuit patterns 520. In some embodiments, L3 is in a range from about 2 nm to about 20 nm, and is in a range from about 5 nm to about 10 nm in other embodiments. In some embodiments, P3 is in a range from about 4 nm to about 100 nm, and is in a range from about 10 nm to about 50 nm in other embodiments.

In some embodiments, the total area where the Ru surface is exposed (including the circuit pattern area and the particle attractive areas) is equal to or more than 70% of the area of the EUV mask and is equal to or more than 80% in other embodiments.

In some embodiments, one or more particles 90 fall on the particle attractive regions. The total number of the particles is less than 100 in some embodiments. The particle 90 includes a metallic particle (Ti, Mo, Al, Ru, Ta, Fe and/or Ni), a semiconductor particle (e.g., Si), an organic particle, a ceramic or dielectric particle (silicon oxide, silicon nitride), or the like.

Figure 6:
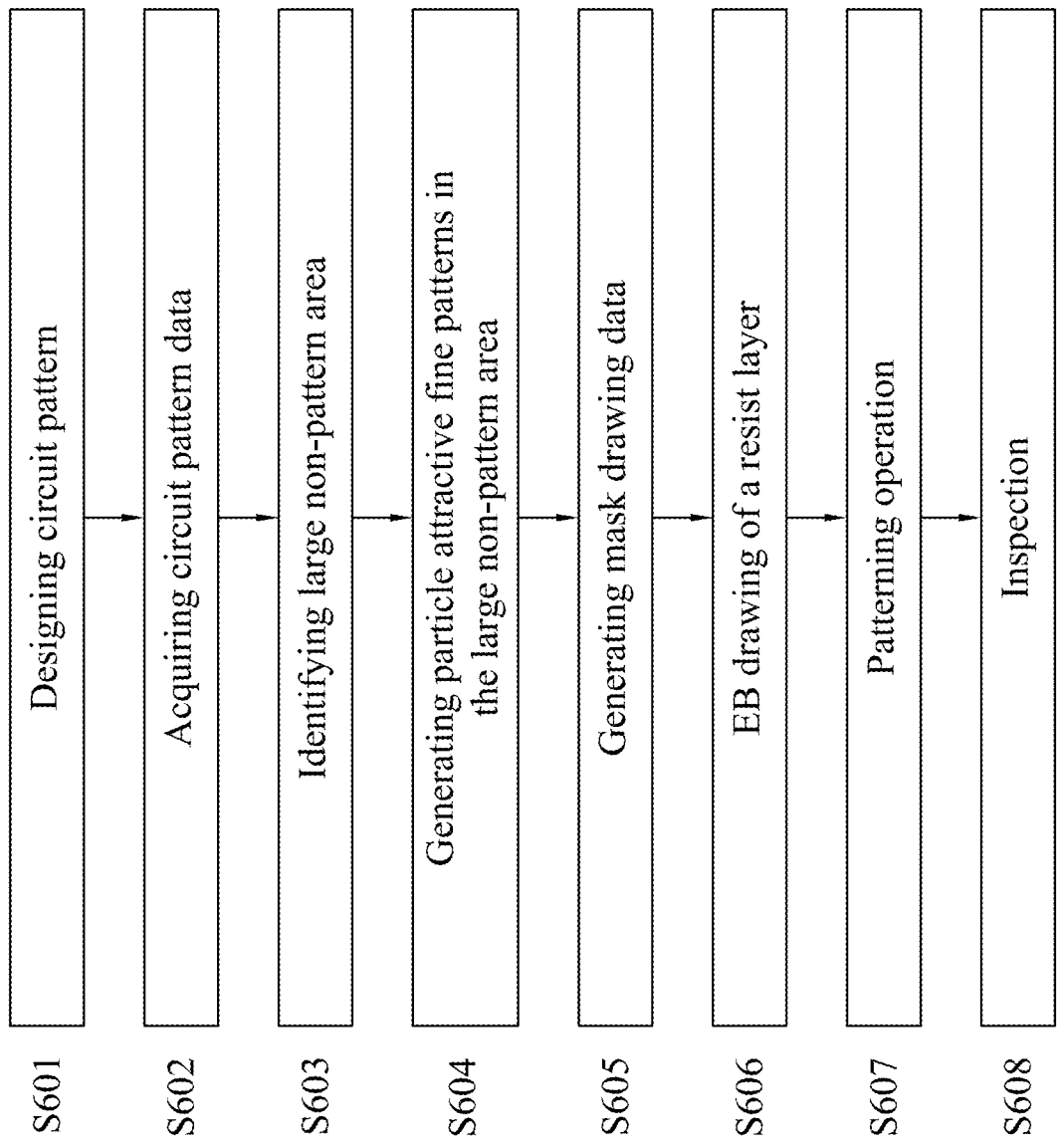
FIG. 6 shows a flowchart illustrating a method of manufacturing EUV masks for a semiconductor manufacturing operation according to an embodiment of the present disclosure.

FIG. 6 shows a flowchart illustrating a method of manufacturing an EUV mask for a semiconductor manufacturing operation according to an embodiment of the present disclosure. It is understood that in the sequential manufacturing process, one or more additional operations can be provided before, during, and after the stages shown in FIG. 6 and some of the operations described below can be replaced or eliminated for additional embodiments of the method. The order of the operations/processes may be interchangeable.

At step S601 of FIG. 6, a circuit pattern layout for one layer in a semiconductor device is designed by using a mask design tool (e.g., an electronic design automation (EDA) tool). The circuit pattern layout for one layer is for one EUV mask. In some embodiments, a multiple patterning method is utilized and in such a case, the circuit pattern layout for one layer is divided into multiple EUV masks. The circuit pattern layout is generally expressed by polygon data in, for example, GDS-II stream format or in Open Artwork System Interchange Standard format.

At step S602, circuit pattern layout data created by the mask design tool is acquired by an EUV mask data generating apparatus. The EUV mask data generating apparatus is a separate computer system than the mask design tool in some embodiments, and is a part of the mask design tool in other embodiments.

Then at step S603, one or more non-pattern areas that do not include any circuit patterns and are equal to or larger than a threshold size are identified. The threshold size is 1 $\mu m^2$, 5 $\mu m^2$, 10 $\mu m^2$, or 100 $\mu m^2$, or any number between 1 $\mu m^2$ to 100 $\mu m^2$, in some embodiments. When identifying the areas, the area is calculated by avoiding the border areas within the distance D1 from the circuit pattern area.

At step S604, fine patterns for the particle attractive regions are generated for the large non-pattern areas identified at step S603.

Then, at step S605, the original circuit pattern layout data and the fine pattern data for the particle attractive regions are combined to generate mask drawing data for an electron beam lithography tool. In some embodiments, the electron beam lithography tool requires its own data format, and in such a case, a format conversion operation is performed on the mask drawing data.

At step S606, according to the mask drawing data, a photo resist layer formed on an EUV mask blank is exposed with an electron beam. Then, the exposed photo resist layer is developed with a developing solution at step S607, and by using the developed photo resist pattern as an etching mask, the anti-reflection layer 35 and the absorber 30 are etched by dry and/or wet etching and a mask pattern is formed on the mask substrate. Then, at S608, mask inspection and mask repair operations are performed. In some embodiments, in the mask inspection operations, the particle attractive regions 60 are excluded from inspection areas. Further, in some embodiments, in the mask repair operations, defective patterns and/or particles disposed in the particle attractive regions 60 are excluded from the repair operation.

Figure 7A:
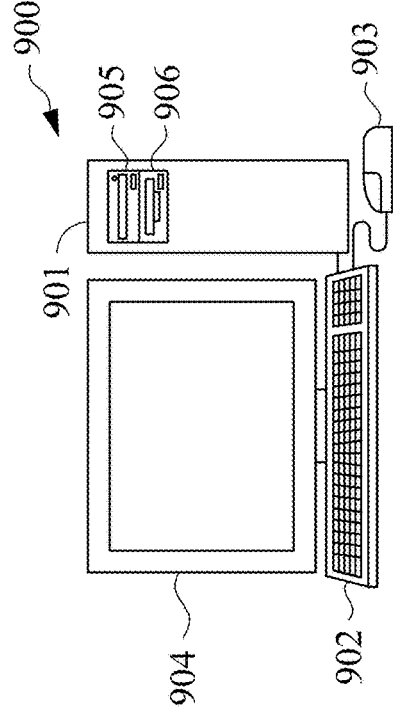
FIGS. 7A and 7B show a photo mask data generating apparatus according to an embodiment of the present disclosure.
Figure 7B:
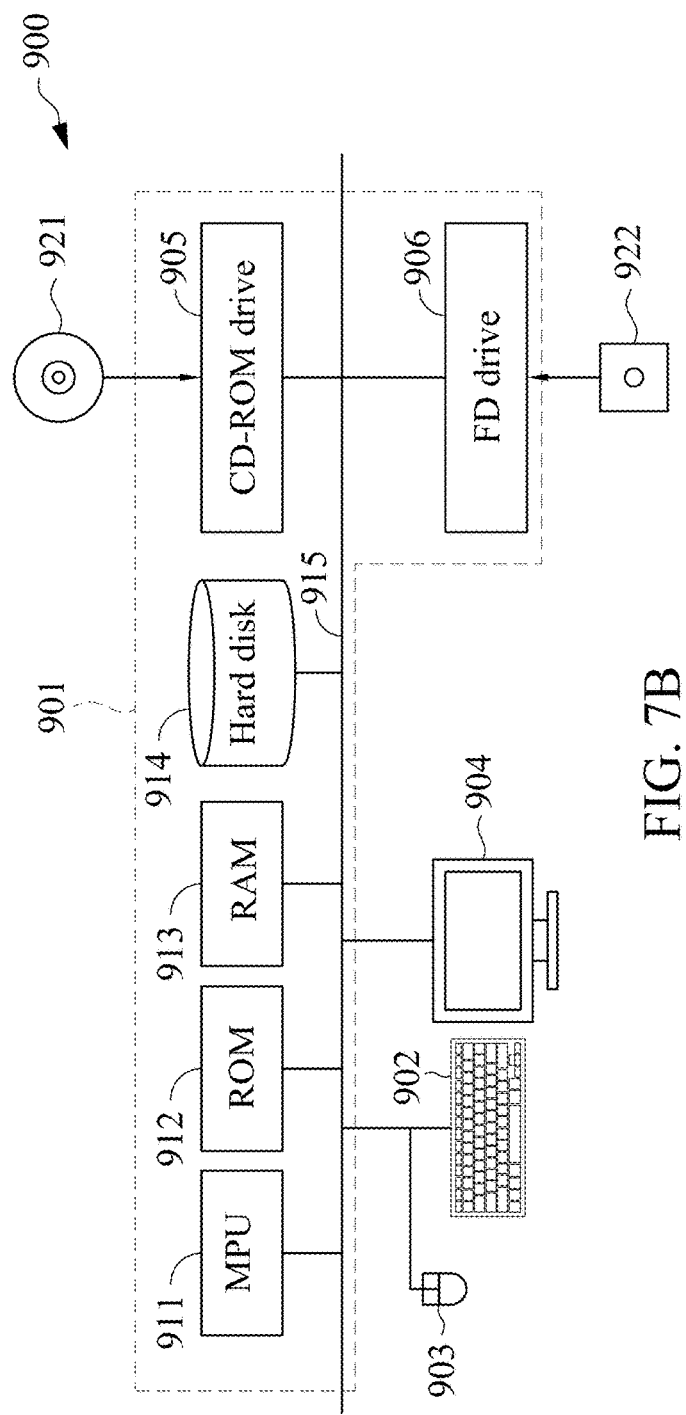

FIGS. 7A and 7B show a photo mask data generating apparatus according to an embodiment of the present disclosure. FIG. 7A is a schematic view of a computer system that executes the photo mask data generating process according to one or more embodiments as described above. All of or a part of the process, method and/or operations of the foregoing embodiments can be realized using computer hardware and computer programs executed thereon. In FIG. 7A, a computer system 900 is provided with a computer 901 including an optical disk read only memory (e.g., CD-ROM or DVD-ROM) drive 905 and a magnetic disk drive 906, a keyboard 902, a mouse 903, and a monitor 904.

FIG. 7B is a diagram showing an internal configuration of the computer system 900. In FIG. 7B, the computer 901 is provided with, in addition to the optical disk drive 905 and the magnetic disk drive 906, one or more processors 911, such as a micro processing unit (MPU), a ROM 912 in which a program such as a boot up program is stored, a random access memory (RAM) 913 that is connected to the MPU 911 and in which a command of an application program is temporarily stored and a temporary storage area is provided, a hard disk 914 in which an application program, a system program, and data are stored, and a bus 915 that connects the MPU 911, the ROM 912, and the like. Note that the computer 901 may include a network card (not shown) for providing a connection to a LAN.

The program for causing the computer system 900 to execute the functions of the photo mask data generating apparatus in the foregoing embodiments may be stored in an optical disk 921 or a magnetic disk 922, which are inserted into the optical disk drive 905 or the magnetic disk drive 906, and transmitted to the hard disk 914. Alternatively, the program may be transmitted via a network (not shown) to the computer 901 and stored in the hard disk 914. At the time of execution, the program is loaded into the RAM 913. The program may be loaded from the optical disk 921 or the magnetic disk 922, or directly from a network.

The program does not necessarily have to include, for example, an operating system (OS) or a third party program to cause the computer 901 to execute the functions of the photo mask data generating apparatus in the foregoing embodiments. The program may only include a command portion to call an appropriate function (module) in a controlled mode and obtain desired results.

In the programs, the functions realized by the programs do not include functions that can be realized only by hardware in some embodiments. For example, functions that can be realized only by hardware, such as a network interface, in an acquiring unit that acquires information or an output unit that outputs information are not included in the functions realized by the above-described programs in some embodiments. Furthermore, a computer that executes the programs may be a single computer or may be multiple computers.

Further, the entirety of or a part of the programs to realize the functions of the photo mask data generating apparatus is a part of another program used for photo mask fabrication processes in some embodiments. In addition, the entirety of or a part of the programs to realize the functions of the photo mask data generating apparatus is realized by a ROM made of, for example, a semiconductor device in some embodiments.

Figure 8:
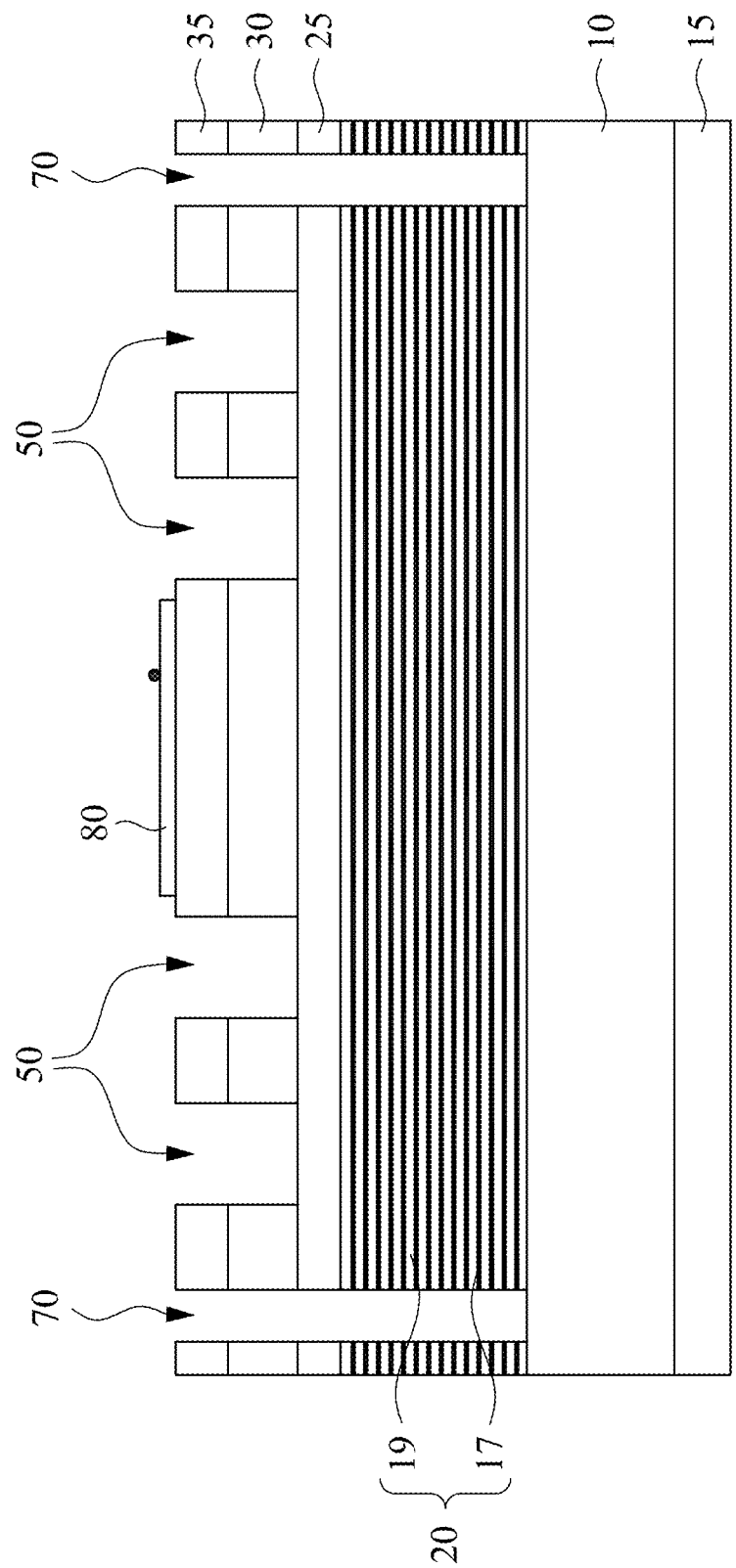
FIG. 8 shows a cross sectional view of an EUV mask according to an embodiment of the present disclosure.

FIG. 8 shows a cross sectional view of an EUV mask according to another embodiment of the present disclosure. Materials, configurations, dimensions, processes and/or operations explained with respect to the foregoing embodiments may be employed in the following embodiments, and detailed explanation thereof may be omitted.

In the foregoing embodiments, one or more particle attractive regions 60 include fine patterns 65 exposing the Ru surface of the capping layer 25 (see, FIG. 3). In the following embodiments, a thin conductive layer 80 is formed in the particle attractive regions, as shown in FIG. 8.

As the conductive layer 80, materials that sufficiently absorb or transmit the EUV light is used. In some embodiments, the conductive layer 80 has higher conductivity than the topmost layer except the conductive layer 80. In certain embodiments, the conductive layer 80 has a higher conductivity than the anti-reflection layer 35 and/or the absorber layer 30.

Figure 10:
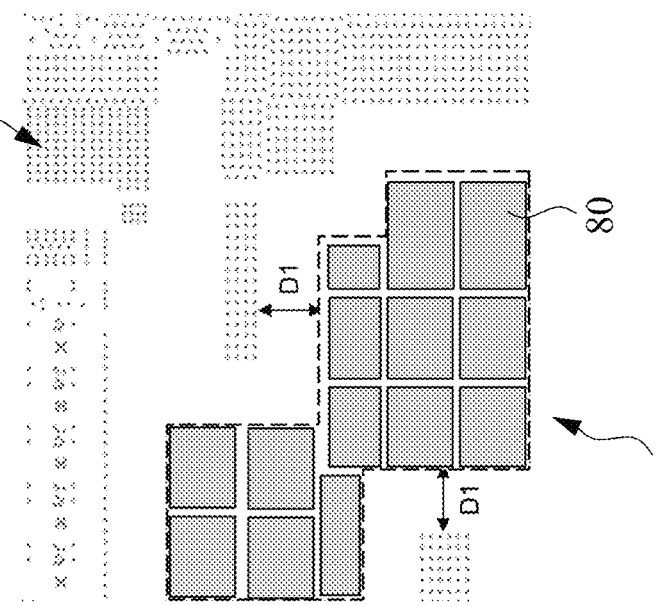
FIG. 10 shows a layout after the particle attractive patterns are added to a mask pattern according to another embodiment of the present disclosure.
Figure 9:
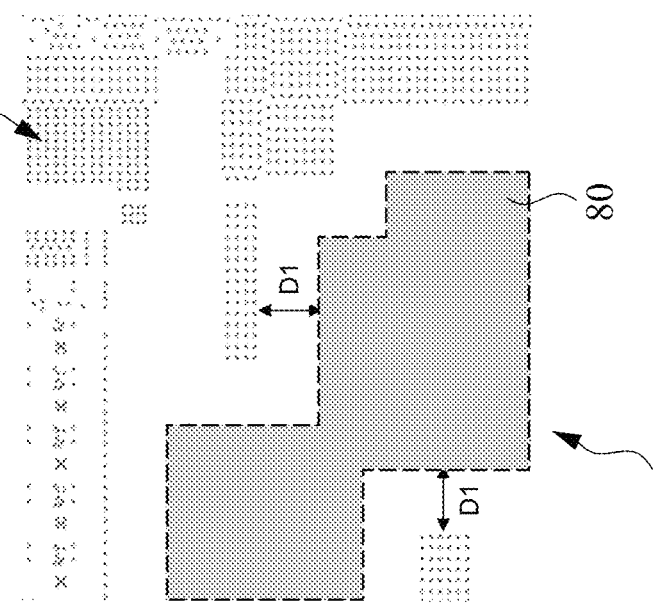
FIG. 9 shows a layout after the particle attractive patterns are added to a mask pattern according to another embodiment of the present disclosure.

In some embodiments, the conductive layer 80 is made of Ru, Zr, Mo or other suitable conductive material. A thickness of the conductive layer 80 is in a range from about 0.2 nm to about 2 nm in some embodiments. In some embodiments, the conductive layer 80 is disposed only in the particle attractive regions and in other embodiments, the conductive layer 80 is disposed over the entire upper surface of the anti-reflection layer 35. The conductive layer 80 is one continuous pattern within each particle attractive area 60 in some embodiments, as shown in FIG. 9. In other embodiments, multiple patterned conductive layers (same or different sizes), each of which is larger than a resolution limit of an EUV exposure apparatus with which the EUV mask is used, are disposed in each particle attractive area, as shown in FIG. 10. In other embodiments, the multiple patterned conductive layers are smaller than the resolution limit of an EUV exposure apparatus.

The EUV masks of the foregoing embodiments are used in EUV lithography.

FIG. 11 shows particle counts on an absorber surface and on a Ru surface according to embodiments of the present disclosure. The particles are counted after a mask is used in different EUV exposure tools A and B. As shown in FIG. 11, the Ru surface is more attractive for particles than the absorber surface.

It will be understood that not all advantages have been necessarily discussed herein, no particular advantage is required for all embodiments or examples, and other embodiments or examples may offer different advantages.

In accordance with one aspect of the present disclosure, an extreme ultraviolet (EUV) mask includes a multilayer Mo/Si stack comprising alternating Mo and Si layers disposed over a first major surface of a mask substrate, a capping layer made of ruthenium (Ru) disposed over the multilayer Mo/Si stack, and an absorber layer on the capping layer. The EUV mask includes a circuit pattern area and a particle attractive area, and the capping layer is exposed at bottoms of patterns in the particle attractive area. In one or more of the foregoing and following embodiments, the patterns in the particle attractive area have dimension less than a resolution limit of an EUV exposure apparatus with which the EUV mask is used. In one or more of the foregoing and following embodiments, the patterns in the particle attractive area are line-and-space patterns. In one or more of the foregoing and following embodiments, a pitch of the line-and-space patterns is smaller than $\lambda/(2NA)$ on a wafer, where $\lambda$ is a wavelength of EUV light and NA is a numerical aperture of the EUV exposure apparatus. In one or more of the foregoing and following embodiments, at least one particle is disposed on the capping layer exposed in the particle attractive area. In one or more of the foregoing and following embodiments, the circuit pattern area and the particle attractive area are spaced apart from each other by at least 0.5 μm.

In accordance with another aspect of the present disclosure, an extreme ultraviolet (EUV) mask includes a multilayer Mo/Si stack comprising alternating Mo and Si layers disposed over a first major surface of a mask substrate, a capping layer made of ruthenium (Ru) disposed over the multilayer Mo/Si stack, and an absorber layer on the capping layer. The EUV mask includes a circuit pattern area and a particle attractive area, and a conductive layer is formed as a topmost layer over the absorber layer in the particle attractive area. In one or more of the foregoing and following embodiments, the conductive layer has a higher conductivity than the absorber layer. In one or more of the foregoing and following embodiments, the EUV mask includes an anti-reflection layer disposed over the absorber layer, and the conductive layer is disposed over the anti-reflection layer. In one or more of the foregoing and following embodiments, the conductive layer has a higher conductivity than the anti-reflection layer. In one or more of the foregoing and following embodiments, the conductive layer is made of Ru, Zr or Mo. In one or more of the foregoing and following embodiments, a thickness of the conductive layer is in a range from 0.2 nm to 2 nm. In one or more of the foregoing and following embodiments, at least one particle is disposed on the conductive layer in the particle attractive area. In one or more of the foregoing and following embodiments, the circuit pattern area and the particle attractive area are spaced apart from each other by at least 0.5 μm. In one or more of the foregoing and following embodiments, the conductive layer is disposed in the circuit pattern area.

In accordance with another aspect of the present disclosure, in a method of making an EUV mask, circuit pattern data is acquired. One or more non-pattern areas are identified. Particle attractive patterns are generated for the one or more non-pattern areas. Mask drawing data are generated from the circuit pattern data and the particle attractive patterns. The EUV mask is manufactured using the generated mask drawing data. In one or more of the foregoing and following embodiments, when the EUV mask inspected and the one or more non-pattern areas are not inspected. In one or more of the foregoing and following embodiments, the particle attractive patterns include line-and-space patterns. In one or more of the foregoing and following embodiments, a pitch of the line-and-space patterns is smaller than $\lambda/(2NA)$ on a wafer, where $\lambda$ is a wavelength of EUV light and NA is a numerical aperture of an EUV exposure apparatus. In one or more of the foregoing and following embodiments, particle attractive patterns comprise one continuous pattern for each of the one or more non-pattern areas. In one or more of the foregoing and following embodiments, the particle attractive patterns comprise multiple patterns for each of the one or more non-pattern areas, each of which is larger than a resolution limit of an EUV exposure apparatus with which the EUV mask is used. In a method of manufacturing a semiconductor device, a resist pattern by using the EUV mask according to one or more of the foregoing and the following embodiments over a substrate. In one or more of the foregoing and following embodiments, at least one particle is adsorbed on the capping layer exposed in the particle attractive area.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet (EUV) mask, comprising:
a multilayer reflective layer;
a capping layer disposed over the multilayer reflective layer; and
an absorber layer on the capping layer, wherein:
the EUV mask includes a circuit pattern area and a particle attractive area which comprises a possibility of particle falling than the circuit area,
the patterns in the particle attractive area have dimension less than a resolution limit of an EUV exposure apparatus with which the EUV mask is used, and
the circuit pattern area and the particle attractive area are spaced apart from each other by at least 0.5 µm.

2. The EUV mask according to claim 1, wherein the patterns in the particle attractive area are divided into group of patterns, each of which has a rectangular area.

3. The EUV mask according to claim 1, wherein the patterns in the particle attractive area are line-and-space patterns.

4. The EUV mask according to claim 1, wherein the capping layer is exposed at bottoms of patterns in the particle attractive area.

5. A method of manufacturing a semiconductor device, comprising:
forming a resist pattern by using the EUV mask according to claim 1 over a substrate,
wherein no resist pattern after development is formed from the patterns in the particle attractive area.

6. The method of claim 5, further comprising adsorbing at least one particle on the capping layer exposed in the particle attractive area.

7. An extreme ultraviolet (EUV) mask, comprising:
a multilayer reflective layer;
a capping layer disposed over the multilayer reflective layer; and
an absorber layer on the capping layer,
wherein the EUV mask includes a circuit pattern area and a particle attractive area, and
a conductive layer having a conductivity higher than the absorber layer is formed as a topmost layer in the particle attractive area.

8. The EUV mask according to claim 7, wherein no conductive layer is disposed in the circuit pattern area.

9. The EUV mask according to claim 7, further comprising an anti-reflection layer disposed over the absorber layer, wherein the conductive layer is disposed on the anti-reflection layer.

10. The EUV mask according to claim 9, wherein the conductive layer has a higher conductivity than the anti-reflection layer.

11. The EUV mask according to claim 7, wherein the conductive layer is made of Ru, Zr or Mo.

12. The EUV mask according to claim 7, wherein a thickness of the conductive layer is in a range from 0.2 nm to 2 nm.

13. The EUV mask according to claim 7, wherein at least one particle is disposed on the conductive layer in the particle attractive area.

14. The EUV mask according to claim 7, wherein the circuit pattern area and the particle attractive area are spaced apart from each other by at least 0.5 µm.

15. An extreme ultraviolet (EUV) mask, comprising:
a multilayer reflective layer;
a capping layer disposed over the multilayer reflective layer; and
an absorber layer on the capping layer,
wherein the EUV mask includes a circuit pattern area and a particle attractive area, and
a conductive pattern is formed as a topmost layer in the particle attractive area, and
a size of the conductive pattern is smaller than a patter of the absorber layer on which the conductive pattern is disposed.

16. The EUV mask according to claim 15, wherein the conductive layer is made of Ru.

17. The EUV mask according to claim 15, wherein the conductive layer is made of Zr.

18. The EUV mask according to claim 15, wherein the conductive layer is made of Mo.

19. The EUV mask according to claim 15, wherein no conductive layer is disposed in the circuit pattern area.

20. The EUV mask according to claim 15, wherein a thickness of the conductive layer is in a range from 0.2 nm to 2 nm.

* * * * *